(12) United States Patent
Lutley et al.

(10) Patent No.: US 6,362,668 B1
(45) Date of Patent: Mar. 26, 2002

(54) CIRCUIT AND METHOD FOR FREQUENCY GENERATOR CONTROL

(75) Inventors: James W. Lutley, Southampton; Neil P. Raftery, Guildford, both of (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/534,411

(22) Filed: Mar. 23, 2000

(51) Int. Cl.[7] .............................................. H03B 19/00
(52) U.S. Cl. ..................... 327/113; 327/116; 327/160
(58) Field of Search .............................. 327/113, 116, 327/119–122, 159, 160, 162, 163

(56) References Cited

U.S. PATENT DOCUMENTS

| | | | |
|---|---|---|---|
| 4,882,709 A | 11/1989 | Wyland | 365/189.02 |
| 5,513,358 A * | 4/1996 | Lundberg et al. | 327/143 |
| 5,559,458 A * | 9/1996 | Holler et al. | 327/143 |
| 5,828,606 A | 10/1998 | Mick | 365/189.05 |
| 5,838,631 A | 11/1998 | Mick | 365/233 |
| 5,841,732 A | 11/1998 | Mick | 365/233 |
| 5,875,151 A | 2/1999 | Mick | 365/233 |
| 6,081,478 A | 6/2000 | Mick et al. | 365/233 |
| 6,094,399 A | 7/2000 | Mick | 365/233 |
| 6,219,395 B1 * | 4/2001 | Pollack et al. | 327/156 |

* cited by examiner

*Primary Examiner*—Kenneth B. Wells
(74) *Attorney, Agent, or Firm*—Christopher P. Maiorana, P.C.

(57) ABSTRACT

An apparatus including a first circuit and a second circuit. The first circuit may be configured to generate one or more enable signals in response to a first control signal and a clock signal. The second circuit may be configured to generate an output signal in response to the one or more enable signals and the clock signal. The first circuit is configured to sample a frequency of the clock signal.

19 Claims, 2 Drawing Sheets

CIRCUIT AND METHOD FOR FREQUENCY GENERATOR CONTROL

FIELD OF THE INVENTION

The present invention relates to a method and/or architecture for frequency generation control generally and, more particularly, to a method and/or architecture for frequency generation control that minimizes power consumption.

BACKGROUND OF THE INVENTION

Conventional frequency generators may use a large amount of current. For low power designs, current consumption of frequency generators can be a significant part of the operating current (ICC) and the stand-by current (ISB) of a device. It would be desirable to minimize the current used by frequency generators.

SUMMARY OF THE INVENTION

The present invention concerns an apparatus comprising a first circuit and a second circuit. The first circuit may be configured to generate one or more enable signals in response to a first control signal and a clock signal. The second circuit may be configured to generate an output signal in response to the one or more enable signals and the clock signal. The first circuit may be configured to sample a frequency of the clock signal.

The objects, features and advantages of the present invention include providing a method and/or architecture for controlling a frequency generator that may (i) sample an external clock frequency, allowing a generator to be deselected most of the time, thereby saving current consumption (ICC); (ii) generate a sample at regular intervals; (iii) detect a power-up and suspend the sample until the board clock has locked to the correct frequency; (iv) allow a separate external reset that forces a system reset and a frequency sample; and/or (v) detect illegal internal logic states in the system and force both a reset and the frequency sample to ensure a correct frequency.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a method and architecture to minimize current in a frequency generator. The present invention may sample the frequency every X number of cycles (where X is an integer). The frequency generator may be deselected most of the time. Therefore, the average current drawn by the frequency generator over X cycles may be significantly reduced. The frequency generator and sampler may be controlled by a circuit that selects and deselects the frequency generator at regular intervals.

Figure 1:
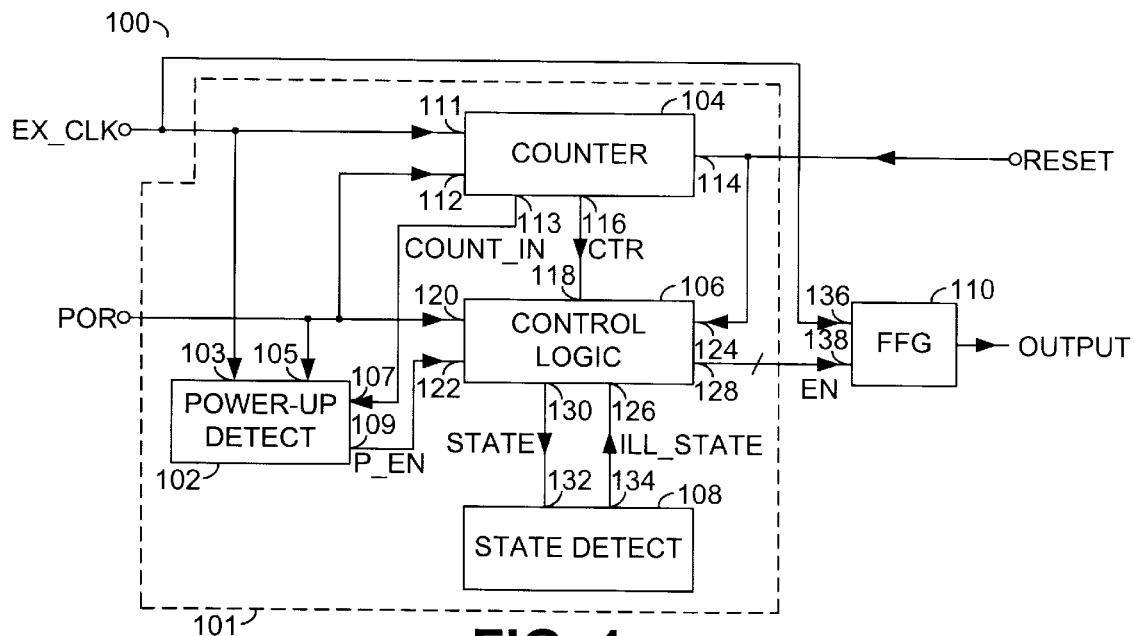
FIG. 1 is a block diagram of a preferred embodiment of the present invention.
Figure 2:
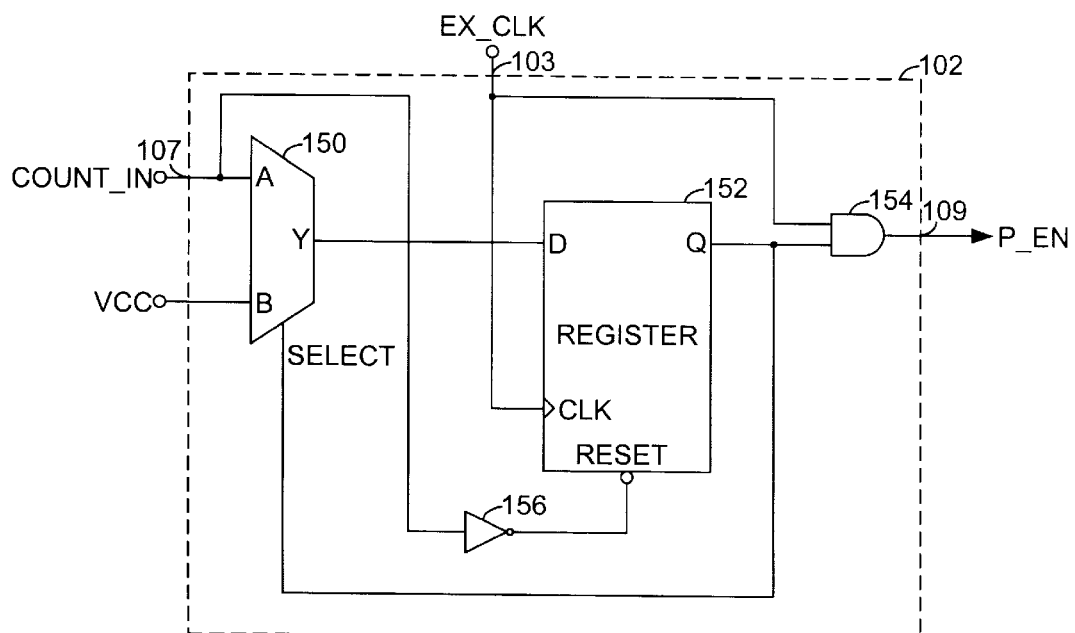
FIG. 2 is a detailed block diagram of the power-up detect circuit of FIG. 1.

Referring to FIG. 1, a block diagram of a circuit 100 is shown in accordance with a preferred embodiment of the present invention. The circuit 100 may be implemented as a control circuit for a frequency generator that activates every X number of cycles to sample the external clock frequency, where X is an integer. The circuit 100 generally comprises a power-up detect circuit 102, a counter circuit 104, a control logic block (or circuit) 106, an illegal state detect block (or circuit) 108, and an output block (or circuit) 110.

The power-up circuit 102 may have an input 103 that may receive a signal (e.g., EX_CLK), an input 105 that may receive a signal (e.g., POR), an input 107 that may receive a signal (e.g., COUNT_IN) and an output 109 that may present a signal (e.g., P_EN). The signal EX_CLK may be an external clock signal. The signal POR may be a power on reset signal. The signal P_EN may be an enable signal.

The counter block 104 may have an input 111 that may receive the clock signal EX_CLK, an input 112 that may receive the signal POR, an output 113 that may present the signal COUNT_IN, an input 114 that may receive a signal RESET and an output 116 that may present the signal (e.g., CTR) to an input 118 on the control logic block 106. The control logic block 106 may also have an input 120 that may receive the signal POR, an input 122 that may receive the signal P_EN, an input 124 that may receive the signal RESET, an input 126 that may receive a signal (e.g., ILL_STATE), an output 128 that may present the signal (e.g., EN) and an output 130 that may present a signal STATE.

The illegal state detect circuit 108 may have an input 132 that may receive the signal STATE and an output 134 that may present the signal ILL_STATE. The output block 110 may have an input 136 that may receive the clock signal EX_CLK and an input 138 that may receive the signal EN. In one example, the signal EN may be a multi-bit signal.

The power-up detect circuit 102 generally comprises a multiplexer 150, a register 152 and a gate 154. The multiplexer 150 may have a first input (e.g., A) that may receive the signal COUNT_IN, a second input (e.g., B) that may receive the supply voltage and an output (e.g., Y) that may present a signal to a register 152. The multiplexer 150 may present the signal COUNT_IN, or the supply voltage VCC, in response to a signal SELECT. The register 152 may have a clock input that may receive the signal EX_CLK, a reset input that may receive the signal COUNT_IN (through an inverter 156) and a Q output that may present the signal SELECT to the multiplexer 150, as well as to an input of the gate 154. A second input of the gate 154 may receive the signal EX_CLK. The gate 154 may present the signal P_EN. In one example, the gate 154 may be implemented as a NAND gate. However, other gates may be implemented accordingly to meet the design criteria of the particular implementation. Additionally, the signal COUNT_IN may be presented to an inverted input of the register 152. However, if the register 152 has a non-inverted input, the inverter 156 may not be necessary. In particular, polarity of the various signals may be adjusted accordingly to meet the design criteria of a particular implementation.

The output circuit 110 generally comprises a frequency sample block (or circuit) 180 and a frequency generator block (or circuit) 182. The output circuit 110 may be implemented, in one example, as a frequency function generator. The signal OUTPUT of the frequency generator 110 generally comprises a signal oscillating at a particular frequency.

Certain memory architectures may require the clock to output enable time (e.g., TcLZ), to be a function of the board clock frequency. In order to minimize current consumption (e.g., ICC) when using the present invention, the clock frequency is generally sampled. This sampling allows the frequency generator 110 to be powered down when not used.

The circuit 100 may provide control for the sampling and power-up/power-down of the frequency generator 110. The circuit 100 may also have in-build circuits (e.g., the power up detect circuit 102) that may detect power-up and may alter the sampling frequency to account for the fact that on power-up, the board clock (e.g., driven by a PLL), has not yet locked to the correct frequency.

The counter 104 may control the sample frequency. Every X number of cycles, the signal CTR is sent to the control logic 106. The control logic 106 may then send an enable signal EN_S (e.g., a sampled enable signal), to the frequency generator 110, which then samples the external frequency CLK_EXT. Once the sample is completed, the frequency generator 110 is generally deselected to minimize ICC.

When the circuit 100 powers-up, the power-on reset signal POR may apply a pulse to ensure that the circuit 100 is in the correct state. The power-up detect circuit 102 generally recognizes the pulse of the signal POR and prevents a sample enable until Y number of clock cycles later. The board clock (e.g., the clock signal EX_CLK) is often driven by a phase locked loop (PLL), which may not have locked to the correct frequency until many cycles after power-up. Preventing a sample until the board clock has locked ensures that the frequency generator 110 will generate a function having the correct frequency. The control logic 106 may be configured so that after a power-up event, the sample frequency is increased for Z number of samples. Such sampling may help eliminate erroneous frequency functions if the PLL has still not locked. Once this period is over the system switches back to its default sample frequency.

The control logic 106 may be implemented as a state machine. If some of the possible states are not used, and for some reason the state machine entered such unused states, a system receiving the output of the circuit 100 could hang and either not generate a sample enable, or generate incorrect sample enables. If an illegal state occurs, the state detect circuit 108 may force a system reset. The control logic 106 may then force a new sample to ensure that the frequency generator 110 is generating a function of the correct frequency.

In certain applications the on chip clock may be powered down for long periods of time. Therefore, to ensure that the board clock has not changed, and the frequency generator 110 output is correct, an external reset may over-ride the current system state and trigger a sample.

The signal POR is generated from a separate power-on-reset circuit. On power-up, the signal POR may be driven high and then, after a short delay, may be driven low. The signal POR generally remains low while the circuit 100 is powered-up.

The circuit 100 may prevent the control logic 106 from activating until a certain number of clock cycles has passed. The control logic 106 and the counter 104 are both reset on power-up. Such resetting forces the output (Q) of the D-Type register 152 to be 0. While Q is low, the control clock may be masked, as the gate 154 is turned off.

The signal Q is also used as the multiplexer select. While the signal SELECT is low, the multiplexer 150 uses path A, the counter input. As the counter 104 is reset on power-up, this input is also a 0. This is then fed into the D input of the register 152. While the counter input is low, the signal Q will also stay low on every clock cycle, preventing the control clock from activating.

After a certain number of cycles, the counter input goes high. This forces a 1 into the D input of the register 152. On the next clock edge, Q is driven high. This enables the gate 154 and the control clock is then activated. As Q is now high, the multiplexer 150 now selects path B, which is connected to the positive power supply. During such a condition, the multiplexer 150 may force a 1 into the D input, and the control clock may stay permanently enabled until the next power-up event.

Figure 3:
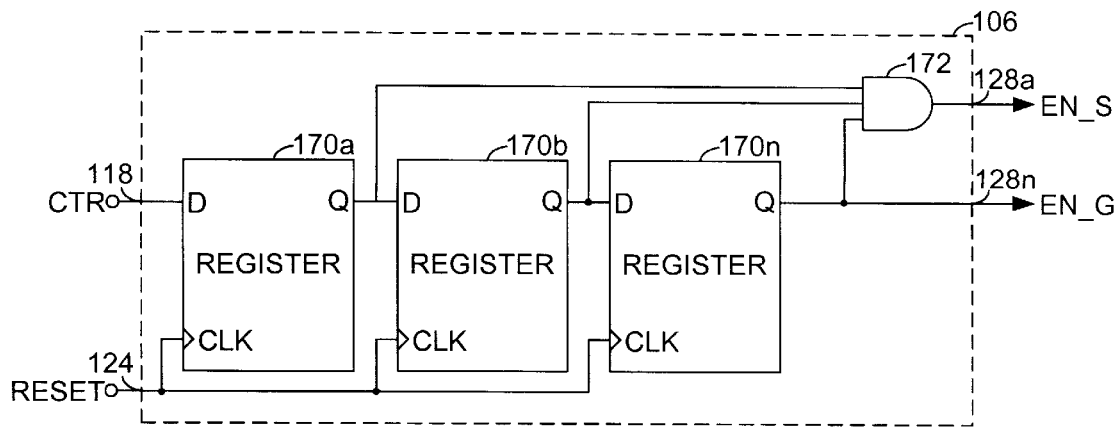
FIG. 3 is a detailed block diagram of the control logic circuit of FIG. 1.
Figure 4:
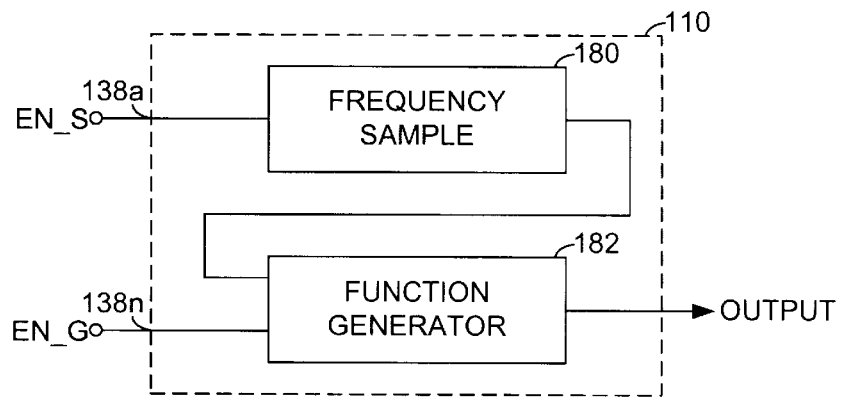
FIG. 4 is a detailed block diagram of the frequency generator circuit of FIG. 1.

Referring to FIG. 3, a more detailed diagram of the control logic block 106 is shown. The control logic block 106 generally comprises a number of registers 170a–170n. Each of the registers 170a–170n generally has a clock input that may see the signal RESET. Additionally, each of the registers 170a–170n presents an output to the gate 172. The gate 172 may combine the outputs of the registers 170a–170n to present an enable signal (e.g., EN_S). Additionally, the output of the register 170a may be presented to an input of the register 170b. The output of the register 170b may be presented to an input of the register 170n. The output of the register 170n may present an enable signal (e.g., EN_G) at an output 128n.

The logic block 106 may be implemented as a simple state machine composed of D-Type registers 170a–170n and some logic. The counter input goes high for one cycle which ripples through the state machine. The state machine may provide two outputs. One output may enable the frequency sample (3 cycles in one implementation) and one output may enable a 1 cycle enable for the frequency generator 110.

The circuit 100 may sample the external clock frequency to generate a clock signal that is ⅓ of the external frequency of the clock signal EX_CLK. The various circuits have been shown as examples and may be implemented in a number of ways for different design implementations.

Figure 5:
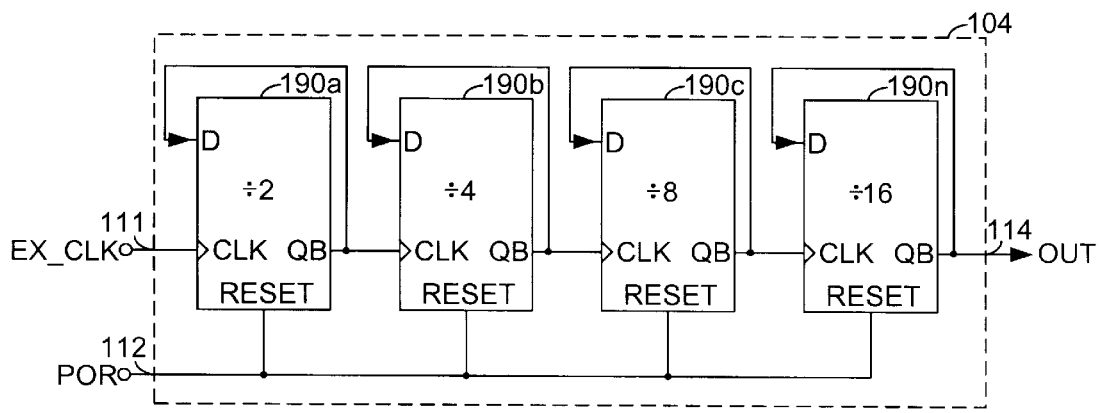
FIG. 5 is a detailed block diagram of a counter block of FIG. 1.

The counter 104 may be implemented as a standard divide-by-2 counter circuit. FIG. 5 illustrates an example of the counter 104. The counter 104 generally comprises a number of registers 190a–190n. The output of one register (e.g., the output Qb of the register 190a) is generally (i) presented to the input (e.g., CLK) of the next register (e.g., 190b). As a result, the register 190a may provide a divide by 2; the register 190b may provide another divide by 2 (or a total divide by 4); the register 190c may provide another divide by 2 (or a total divide by 8); and the register 190n may provide another divide by 2 (or a total divide by 16). For the 4-bit implementation shown, the counter 104 divides the signal EX_CLK by 16. Other bit width counters may be implemented to meet the design criteria of a particular implementation. The signal POR may be presented to the reset inputs of each of the registers 190a–190n. While the registers 190a–190n are shown as D-type registers, other registers may be implemented to meet the design criteria of a particular implementation.

The state detect circuit 108 may be implemented as a simple combinational logic using standard logic gates. The state detect circuit 108 may decode signals received from the state machine. If a particular state is not a valid state, the state detect circuit 108 may force a reset.

The circuit 100 may provide a system for controlling a frequency generator. The circuit 100 may (i) sample the external clock frequency, allowing the generator to be deselected most of the time, thereby saving ICC; (ii) generates a sample at regular intervals; (iii) detect a power-up and suspend the sample until the board clock has locked to the correct frequency; (iv) allows a separate external reset which forces a system reset and a frequency sample; and/or (v) detects illegal logic states in the system and force a reset and a frequency sample.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

We claim:

1. An apparatus comprising:
    a power-up detect circuit configured to generate a first enable signal in response to a first control signal and a clock signal;
    a counter circuit configured to generate a count signal in response to said first control signal and said clock signal;
    a control circuit configured to generate one or more second enable signals in response to said first control signal, said first enable signal and said count signal; and
    an output circuit configured to generate an output signal having a frequency in response to said one or more second enable signals and said clock signal, wherein said output circuit is configured to sample a frequency of said clock signal.

2. The apparatus according to claim 1, wherein said output circuit comprises a frequency generator.

3. The apparatus according to claim 1, wherein said first control signal comprises a power-on-reset signal.

4. The apparatus according to claim 1, further comprising a detect circuit configured to present a second control signal in response to a state signal.

5. The apparatus according to claim 4, wherein said second control signal comprises an illegal state signal.

6. The apparatus according to claim 4, wherein said control circuit is further responsive to said second control signal.

7. The apparatus according to claim 6, wherein said control circuit is further configured to generate said state signal.

8. The apparatus according to claim 1, wherein said power-up detect circuit comprises:
    a multiplexer configured to multiplex said first control signal and present an output signal;
    a first register configured to store said output signal in response to said clock signal and said first control signal; and
    a gate configured to receive an output of said register and said clock signal and present said first enable signal.

9. The apparatus according to claim 1, wherein said first enable signal comprises a power-up enable signal.

10. The apparatus according to claim 1, wherein said control circuit comprises:
    a one or more registers configured to present one or more register output signals in response to said count signal and a reset signal; and
    a gate configured to receive said one or more register output signals and present one of said one or more second enable signals.

11. The apparatus according to claim 10, wherein one of said one or more register output signals comprises another of said one or more second enable signals.

12. The apparatus according to claim 11, wherein said enable signal presented by said gate comprises a frequency sample enable signal and said another enable signal comprises a generator enable signal.

13. The apparatus according to claim 11, wherein said output circuit comprises:
    a frequency sample circuit configured to sample a frequency in response to said enable signal from said gate; and
    a generator circuit configured to generate said output signal in response to said frequency sample circuit and said another enable signal.

14. A method for controlling a frequency output circuit comprising the steps of:
    (A) generating one or more enable signals and an illegal state signal in response to a first control signal and a clock signal;
    (B) generating an output signal in response to said one or more enable signals and said clock signal; and
    (C) sampling a frequency of said clock signal.

15. A method for controlling a frequency output circuit comprising the steps of:
    (A) generating a first enable signal in response to a first control signal and a clock signal;
    (B) generating a count signal in response to said first control signal and said clock signal;
    (C) generating one or more second enable signals in response to said first control signal, said first enable signal and said count signal;
    (D) generating an output signal in response to said one or more second enable signals and said clock signal; and
    (E) sampling a frequency of said clock signal.

16. The method according to claim 15, further comprising the step of:
    generating an illegal state signal in response to a state signal.

17. The method according to claim 15, wherein the step (A) further comprises (i) multiplexing said first control signal and presenting an intermediate signal, (ii) storing said intermediate signal in response to said clock signal and said first control signal and (iii) presenting said first enable signal, wherein said first enable signal comprises a power-up enable signal.

18. The method according to claim 15, wherein the step (C) comprises presenting (i) one of said one or more second enable signals and (ii) another of said one or more second enable signals.

19. The method according to claim 15, wherein said one enable signal comprises a frequency sample enable signal and said another enable signal comprises a generator enable signal.

* * * * *